(12) United States Patent
Ueno

(10) Patent No.: US 6,604,221 B1
(45) Date of Patent: Aug. 5, 2003

(54) ERROR PROPAGATION CONTROL METHOD IN DECISION FEEDBACK EQUALIZATION AND MAGNETIC RECORDING/REPRODUCING DEVICE

(75) Inventor: Hiroaki Ueno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 220 days.

(21) Appl. No.: 09/628,035

(22) Filed: Jul. 27, 2000

Related U.S. Application Data

(63) Continuation of application No. PCT/JP98/05278, filed on Nov. 24, 1998.

(30) Foreign Application Priority Data

Jan. 28, 1998 (JP) .............................. 10-015903

(51) Int. Cl.$^7$ .................. G06F 11/00; G11C 29/00; H03M 13/00; H04L 27/10
(52) U.S. Cl. .................. 714/771; 714/746; 714/799
(58) Field of Search .................. 714/752, 746, 714/799, 771; 360/65; 375/233

(56) References Cited

U.S. PATENT DOCUMENTS

| | | | |
|---|---|---|---|
| 5,774,505 A | 6/1998 | Baugh | 375/348 |
| 5,822,143 A * | 10/1998 | Cloke et al. | 360/65 |
| 6,226,323 B1 * | 5/2001 | Tan et al. | 375/233 |

FOREIGN PATENT DOCUMENTS

| | | | |
|---|---|---|---|
| EP | 0707401 A2 * | 4/1996 | H04L/25/03 |
| JP | 10106157 | 4/1998 | |

OTHER PUBLICATIONS

Kenney et al., Multi Level Decision Feeback Equalization for Saturation Recording, Jul. 1993, IEEE, vol. 29, No. 3, pp. 2160–2171.*

* cited by examiner

Primary Examiner—Albert Decady
Assistant Examiner—Shelly A Chase
(74) Attorney, Agent, or Firm—Greer, Burns & Crain, Ltd.

(57) ABSTRACT

An error propagation control method and a recording/reproducing device which uses the method in a system which makes use of MDFE are disclosed. In the error propagation control method in accordance with multi-level decision feedback equalization in which the input to the detector is fed back to the input side via the feedback filter and the difference between the input signal and the feedback signal is input to the detector, the error propagation state is detected based on the output of the detector. Based on the error propagation detection result, a predetermined offset is added to the slice level of the detector, DC offset is added to the DC level of the input signal of the detector, or a sign of the tap of the feedback filter is reversed.

24 Claims, 16 Drawing Sheets

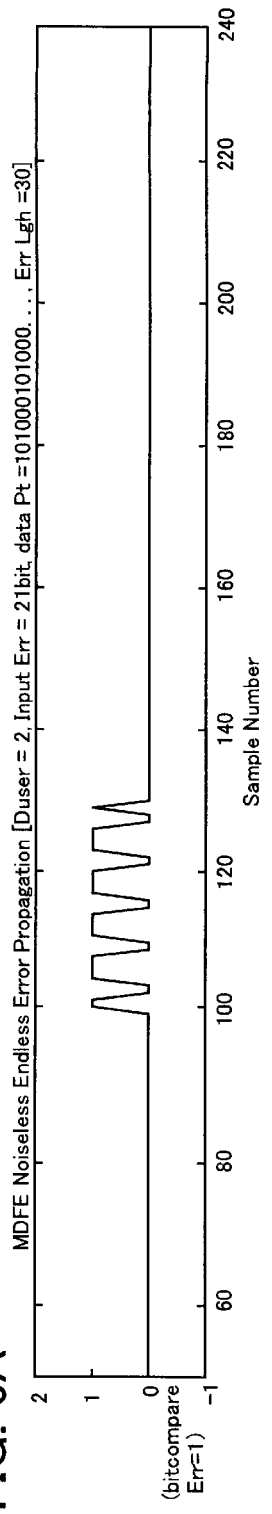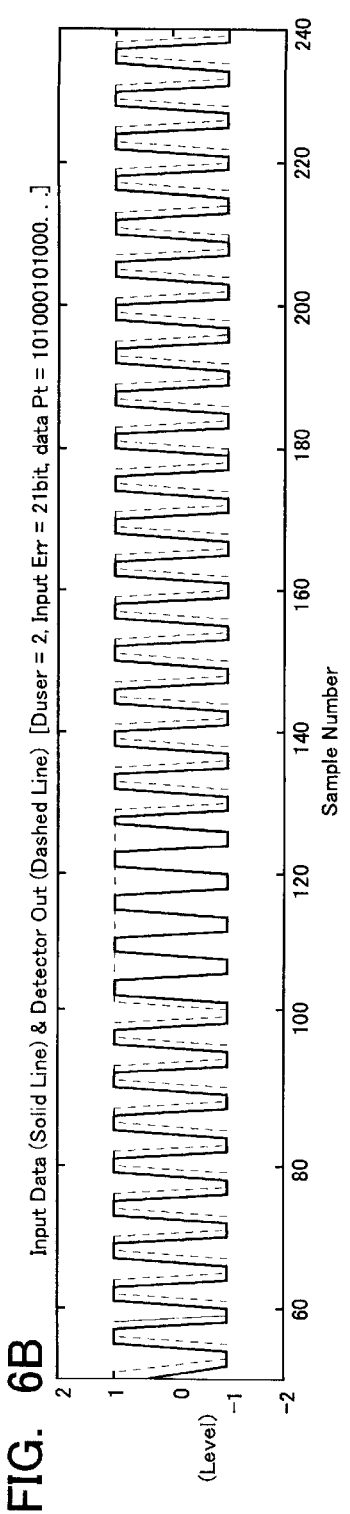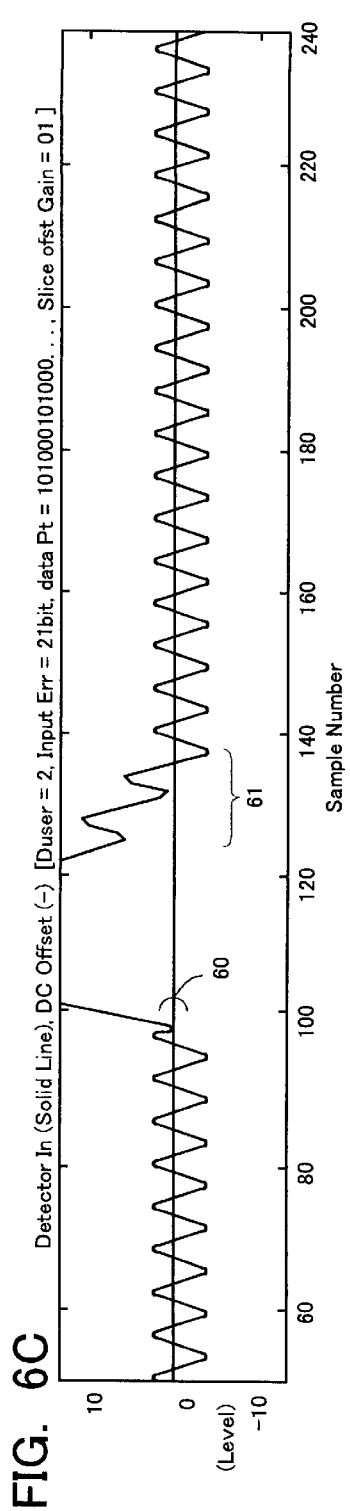

Write Data

Read Signal

FWF Output

FBF Output

Comparator Output
(FWF Output
 − FBF Output)

Detector Output

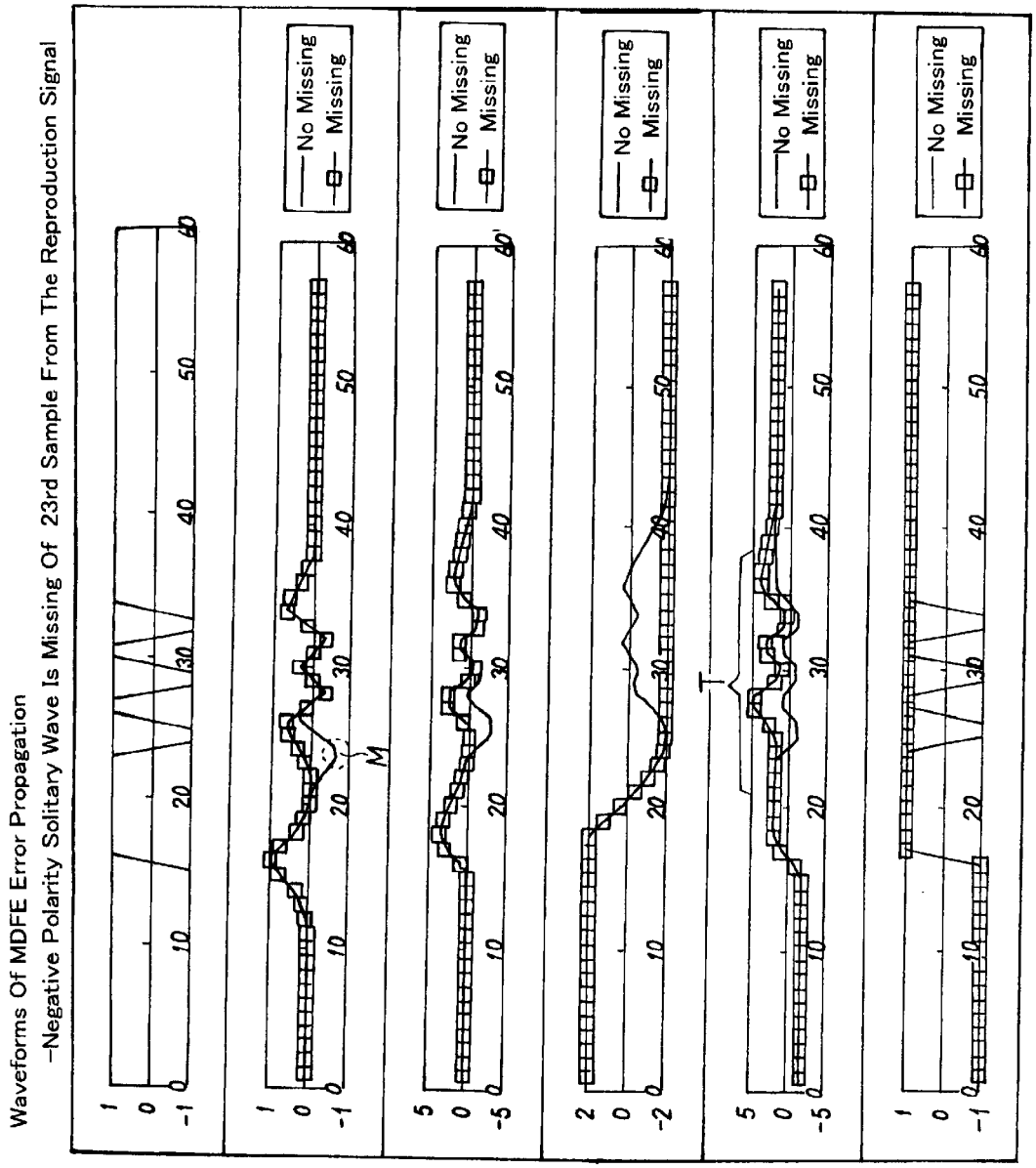

ERROR PROPAGATION CONTROL METHOD IN DECISION FEEDBACK EQUALIZATION AND MAGNETIC RECORDING/REPRODUCING DEVICE

This is a continuation of International Application No. PCT/JP98/05728, filed Nov. 24, 1998.

BACKGROUND OF THE INVENTION

1. Field of the Invention

The present invention relates to an error propagation control method based on decision feedback equalization (DFE) including multi-level decision feedback equalization (MDFE), and to a recording/reproducing device, such as a magnetic disk device, which makes use of this method.

2. Description of the Related Art

Recently, the recording density of magnetic disk devices and magnetic tape recording devices are dramatically increasing. It is expected that the surface recording density of magnetic disk devices will reach 10–20 Gb/in$^2$.

The increase in surface recording density means an increase in transfer speeds. The increase in transfer speeds induces an increase in the recording frequency if the same recording encoding and signal processing method are used, and writing heads have reached its recording limit. Because of this, an improvement in heads and an improvement in recording media are in-progress. Efforts to develop a signal processing method are also being made.

For signal processing, a decrease in the space between bits in particular, and the inter-symbol interference caused by this, deteriorates the signal-to-noise ratio (SNR). A conventional method of using run length limited (RLL) codes, which involves peak detection and read equalization, is insufficient for high densities.

Therefore John G. Kenney and others proposed multi-level decision feedback equalization (MDFE) technology as a new processing method (IEEE Transactions on Magnetics, Vol. 29, NO. Jul. 3, 1993: "Multi-level Decision Feedback Equalization for Saturation Recording").

FIG. 14 is a block diagram of a configuration of a magnetic disk device, which makes use of the decision feedback equalization (DFE) method, including multi-level decision feedback equalization (MDFE), particularly of a signal processing system.

In FIG. 14, an input NRZ signal, which is composed of writing target "1" or "0", is converted by a (1,7) RLL encoder into a (1, 7) RLL code, where the number of "0" s between bit 1 and bit 1 is at least 1 and at most 7, that is, the number of continuous alternations is 1 and the maximum continuance of same polarity codes is 8.

The output of the (1, 7) RLL encoder 1 has a value of ±1 sampled at a timing of 1/T. With respect to the output of the (1, 7) RLL encoder 1, the write FF circuit 2 calculates $(1/1-D)_{mod2}$ sends the calculation result to the write/read head 3 and writes it to a disk.

FIG. 15 shows an example of written and read out waveforms, which are written to and read out from the disk by the above mentioned write/read head 3. The write waveform, which is output from the write FF circuit 2, is as shown in FIG. 15 (A).

In FIG. 14, the data written to the disk is read by the write/read head 3, and is amplified for reproduction to a specific level through a head pre-amplifier circuit 4 and an AGC amplifier 5.

FIG. 15 (B) shows a signal waveform read by the write/read head 3. The output of the AGC amplifier 5 is input to a forward filter 6 of an MDFE circuit 10, and is output as the waveform shown in FIG. 15 (C). In other words, [the output of the AGC amplifier 5] is converted to a ternary signal (−2, 0, +1).

The feedback filter 7 feeds back the sum of the outputs of a detector 9 multiplied by a predetermined coefficient to the input side. When an input pulse is generated, the output of the feedback filter 7 changes the polarity, making it the reverse of the pulse polarity (FIG. 15 (D)). In other words, the feedback filter 7 assumes that the polarity of the reproduction signal pulses alternates. Therefore, the output polarity of the feedback filter 7 is usually the opposite of the polarity of the expected input to the forward filter 6.

A difference circuit 8 determines the difference between the output of the forward filter 6 (FIG. 15 (C)) and the output of the feedback filter 7 (FIG. 15 (D)). As a result, the output of the difference circuit 8 has a waveform centered around the "0" level, as shown in FIG. 15 (E). Here, the difference circuit 8 can be configured such that the sum of the output of the forward filter 6 and the output of the feedback filter 7 is determined.

The output of the difference circuit 8 is then subjected to binary decision by a detector 9. The output of the detector 9 is a binary coded sequence, as shown in FIG. 15 (F), and is set in a quaternary state by 1-bit convolution by the MDFE circuit 10, therefore, [the output of the detector 9] deviates 1 bit from the write data code string (FIG. 15 (A)).

A $(1-D)_{mod2}$ circuit 11 calculates $(1-D)_{mod2}$, which is the inverse of the processing of the write FF circuit 2, and decodes the (1, 7) RLL codes by a (1, 7) decoder 12. In this way the read signal is reproduced.

According to the structure of the magnetic disk device which makes use of the decision feedback equalization (DFE), including multi-level decision feedback equalization (MDFE), the decision result on the read signal by the detector 9 is fed back.

Also, the tap coefficient of the feedback filter 7 is set on the condition that the polarity of the head reproduction signal to be input alternates.

The inventors recognized that errors continue and propagate when the above condition is not satisfied in a system which makes use of the decision feedback equalization (DFE), including multi-level decision feedback equalization (MDFE), and further studied the conditions under which such errors propagate.

SUMMARY OF THE INVENTION

With the foregoing in view, it is an object of the present invention to provide an error propagation control method and a magnetic recording/reproducing device which makes use of this method for use in systems based on decision feedback equalization (DFE), including multi-level decision feedback equalization (MDFE).

The basic constitution of the decision feedback equalization (DFE) method, including multi-level decision feedback equalization (MDFE), for achieving the above mentioned object of the present invention, and the magnetic recording/reproducing device which makes use of this method, involves outputting the difference between or the sum of an input signal and a feedback signal and detecting the level [of the input signal] with respect to the difference or sum signal output based on the slice level.

Then the error propagation of the input signal is decided, and based on the result of the error propagation decision, a predetermined offset is added to the above mentioned slice level.

Also, based on the result of the error propagation decision, a predetermined DC offset is added to the DC level of a signal which level is detected with reference to the above mentioned slice level.

Or, based on the result of the above mentioned error propagation decision, a sign of the tap of the feedback filter, which feeds back the above mentioned detected output to the above mentioned input signal side, is reversed.

An aspect of the present invention is characterized in that the above mentioned error propagation of the input signal is decided based on the output when the signal level is detected with reference to the above mentioned slice level.

Another aspect of the present invention is characterized in that the above mentioned error propagation of the input signal is decided based on the thermal asperity detection signal.

Another aspect of the present invention is characterized in that the input signal to be the target of the above mentioned decision of the error propagation is data, or a preamble, or a synchronous word of the data.

Another aspect of the present invention is characterized in that when the above mentioned input signal for which the difference or sum with the above mentioned feedback signal is determined is encoded with (d, k) run length limited encoding, where the minimum magnetization reversal interval is d and the maximum magnetization reversal interval is k, the state of error propagation to be detected is a d constraint or a k constraint violation state.

Another aspect of the present invention is characterized in that when the above mentioned input signal for which difference or sum with the above mentioned feedback signal is determined is encoded with (1, 7) run length limited encoding, where the minimum magnetization reversal interval is 1 and the maximum magnetization reversal interval is 7, the above mentioned error propagation state is detected by detecting nine samples or more of continuous same polarity signals or by detecting two samples or more of continuous polarity alternations.

Another aspect of the present invention is characterized in that when the above mentioned input signal for which a difference or sum with the above mentioned feedback signal is determined is encoded with (d, k) encoding where the minimum magnetization reversal interval is d and the maximum magnetization reversal interval is k, the above mentioned error propagation state is detected when two samples or more of continuous polar alternations are generated two or more times, or k+2 samples or more of same polarity signals continue.

Another aspect of the present invention is characterized in that when the above mentioned input signal for which a difference or sum with the above mentioned feedback signal is determined is encoded with (d, k) encoding where the minimum magnetization reversal interval is d and the maximum magnetization reversal interval is k, the above mentioned input signal has a plurality of (d, k) limitations, and the decision of violating either a d constraint or a k constraint corresponding to the respective (d, k) limitation can be selected.

Further characteristics of the present invention will become clear from the embodiments of the present invention which are described with reference to the accompanying drawings.

BRIEF DESCRIPTION OF THE DRAWINGS

FIG. 6 is a diagram corresponding to FIG. 5, depicting a case when control to add an offset to the decision criteria (slice level) of the detector 9 by the output of the slice offset control part 21 shown in FIG. 1 is executed;

FIG. 16 is a diagram depicting the case when one symbol of a solitary wave is missing in the reproduction signal.

DESCRIPTION OF THE PREFERRED EMBODIMENTS

Figure 1:
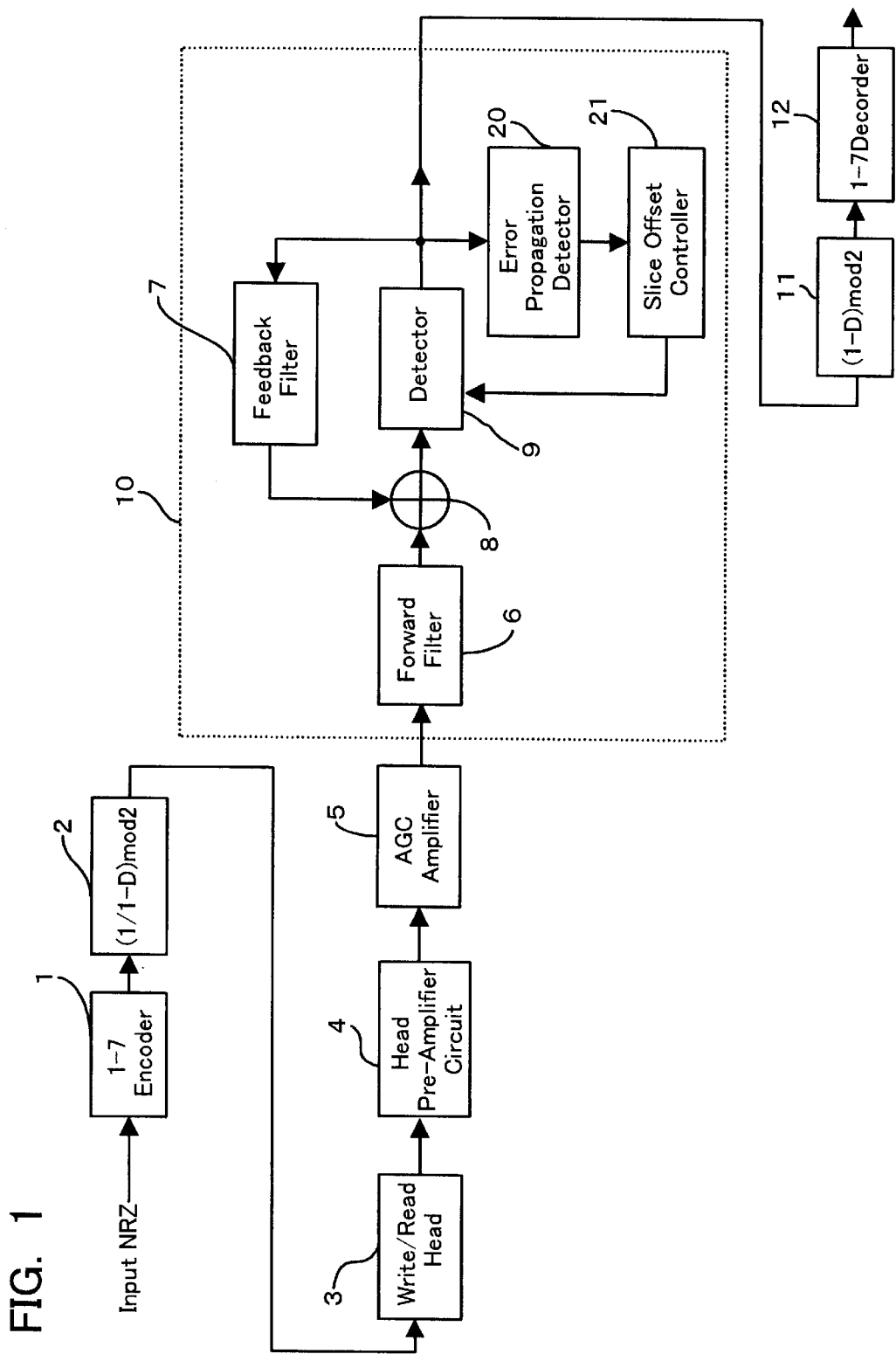
FIG. 1 is a block diagram depicting a first embodiment of the present invention.

Embodiments of the present invention will now be described with reference to the accompanying drawings. In the drawings, components which are the same or similar are labeled with the same reference labels and numbers.

Before describing the embodiments of the present invention, we will describe the contents of error propagation in multi-level decision feedback equalization (MDFE), and the causes [of the error propagation] in order to properly understanding the present invention.

FIG. 16 is a diagram depicting the case when one symbol of a solitary wave is missing from the reproduction signal. FIG. 16 (A) shows a write data waveform which is binary (±1) NRZ codes, and samples 0–60 are shown in the abscissa.

FIG. 16 (B) is a read reproduction signal, where a solid line shows a waveform when all the samples 0–60 are read without a miss. As explained above, this waveform conforms to the condition assuming that the polarity of the read reproduction signal pulse is alternating.

Now it is assumed that the signal at the $23^{rd}$ sample is missing (point M in FIG. 16 (B)), then the read waveform forms a locus shown by the squares, and this waveform does not conform to the condition assuming that the polarity of the input reproduction signal pulse is alternating.

Therefore, the output of the forward filter 6 and the output of the feedback filter 7 become as in FIG. 16 (C) and FIG.

16 (D) respectively. The difference of these outputs is output from the difference circuit 8, and is input to the detector 9 (FIG. 16 (E)).

In other words, the input of the detector 9 (FIG. 16 (E)) is normally a waveform which changes with "0" at the center, but if the same polarity continues in the input reproduction signal pulses due to a missing signal at the $23^{rd}$ sample, the input of the detector 9 becomes a waveform where the center of the changes is the level which is offset by the output value of the forward filter 6.

The detector 9 identifies the signals as 2 values, +1 and −1. Therefore, if the signal at the $23^{rd}$ sample is missed, the output of the detector 9 thereafter remains the same sign (+1 in FIG. 16), even if the sign is reversed during the period T, since the changes do not occur with "0" at the center, and as a result, error propagation occurs (FIG. 16 (F)).

In the case of a missing pulse, however, the output of the detector 9 remains the same sign and an error propagates when an odd number of pulses are missed, but, error propagation does not occur even if an even number of pulses are missed. This is because when an even number of pulses are missed, the feedback filter 7 still conforms to the assumption that the polarity of the reproduction signal pulses alternates.

In a magnetic disk drive, on the other hand, disk control is executed by detecting the voltage at the MR (magnetic resistive element). Normally current is supplied to the MR, and a change of the voltage generated by the resistance component of the MR is used for control. However, if the MR contacts the disk, resistance increases and is detected as the generation of a signal. This is called "thermal asperity".

This case is equivalent to when signals with the same polarity continue for a long period of time, which does not conform to the above assumption where the polarity of the reproduction signal pulses alternates. In such as case as well, error propagation starts.

Also, if a pattern where a low amplitude of reproduction signals, that is, a pattern with narrow magnetization reversal intervals such as "10100 . . . " is frequently input as a reproduction signal during error propagation, the error propagation continues.

This is because if the amplitude of the reproduction signal is low, and does not exceed the decision slice level of the detector 9, then the reversal of polarity is not detected, and this state is regarded as error propagation where pulses with the sample polarity continue.

The present invention is a method for controlling the above mentioned error propagation in a decision feedback equalization (DFE) system, including multi-level decision feedback equalization (MDFE).

FIG. 1 is a block diagram depicting a first embodiment of the present invention, which will be described using multi-level decision feedback equalization (MDFE) as an example. In FIG. 1, the present invention is characterized in the MDFE circuit 10 disposed in the configuration of FIG. 14. Therefore, primarily the block of the MDFE circuit 10 will be described below for FIG. 1, omitting descriptions which overlap with FIG. 14.

Figure 12:
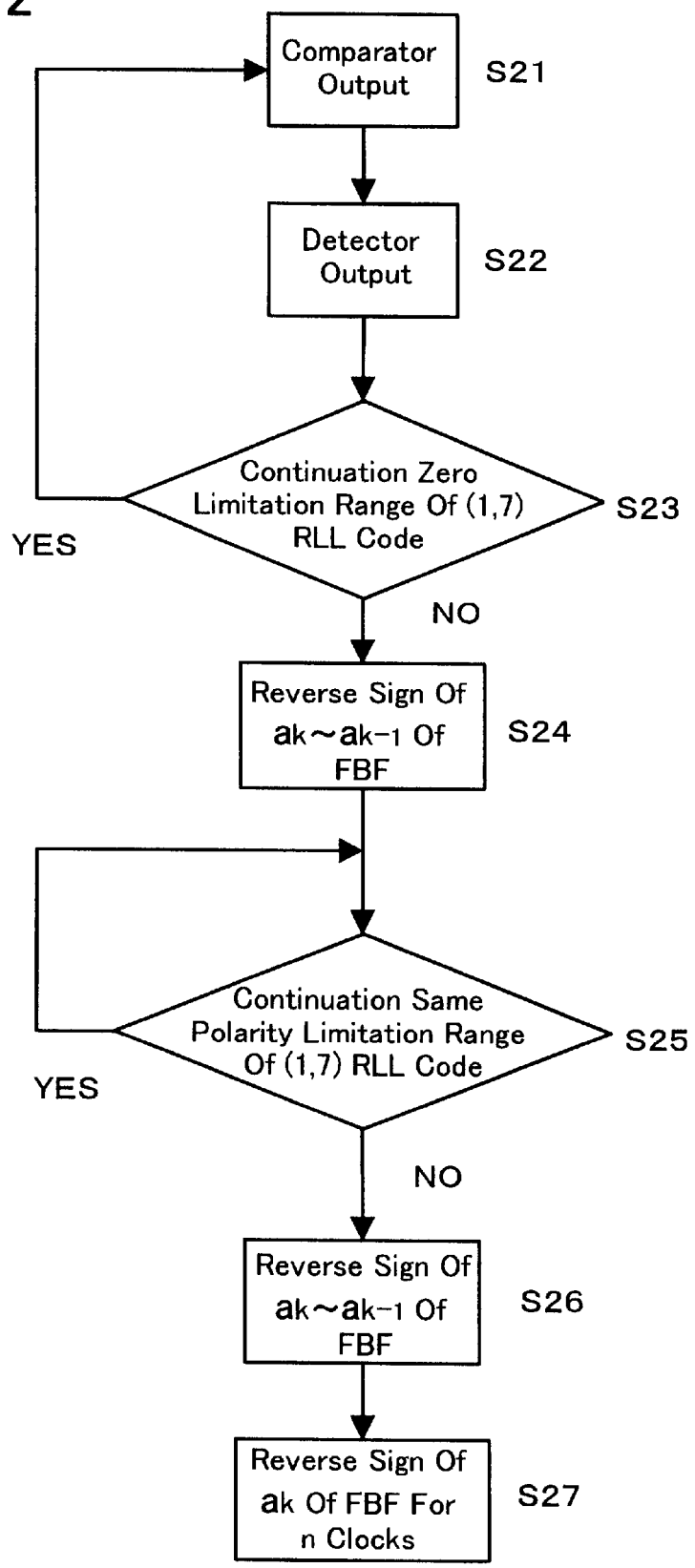
FIG. 12 is an operation flow of the embodiment in FIG. 11.

Also, this embodiment will be described assuming that the magnetic disk device related to FIG. 12 is used, but needless to say the application of the present invention is not limited to a magnetic disk drive, but can be applied to recording devices such as a magneto-optical disk device, magnetic tape device and optical disk device.

Figure 14:
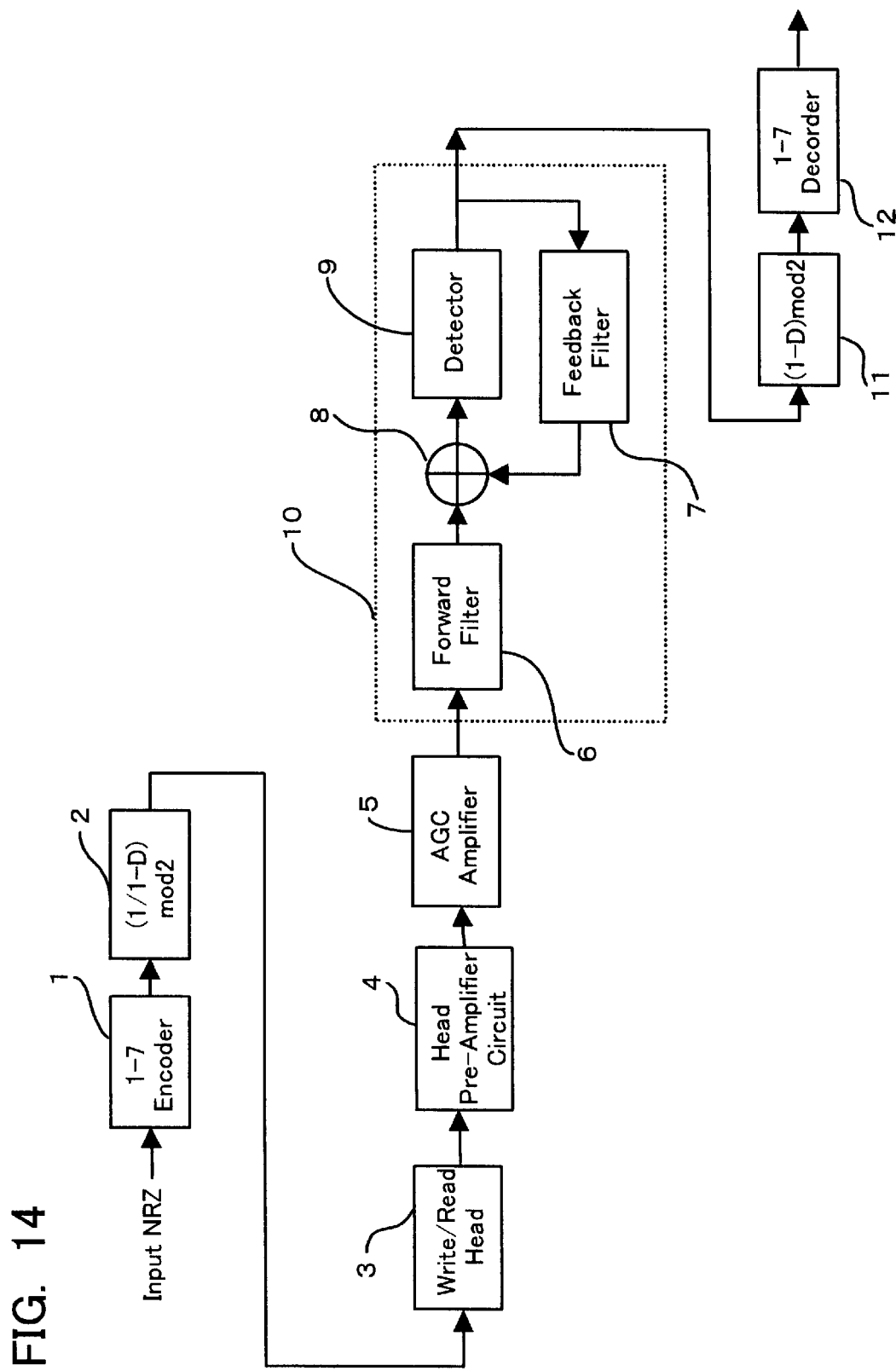
FIG. 14 is a block diagram depicting an example of a magnetic disk device which makes use of MDFE, particularly of the signal processing system.
Figure 15A:
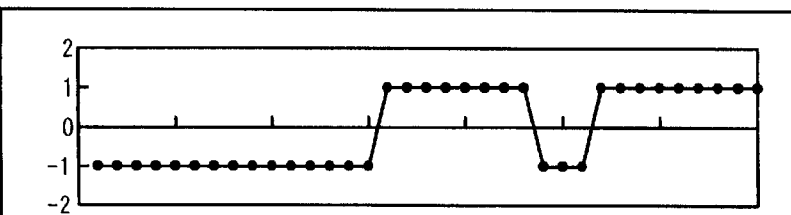
FIG. 15 is a diagram depicting an example of the write/read waveform in the configuration in FIG. 12.
Figure 15B:
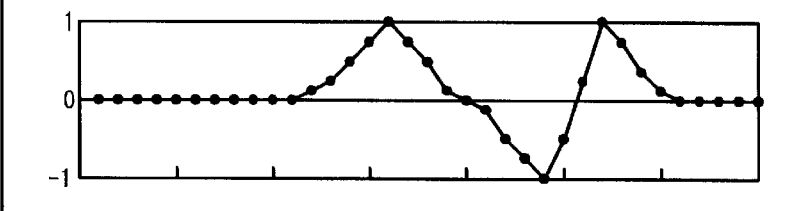
Figure 15C:
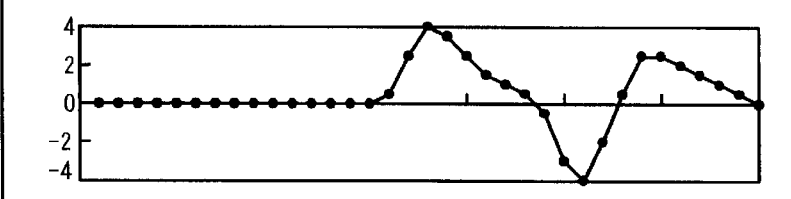
Figure 15D:
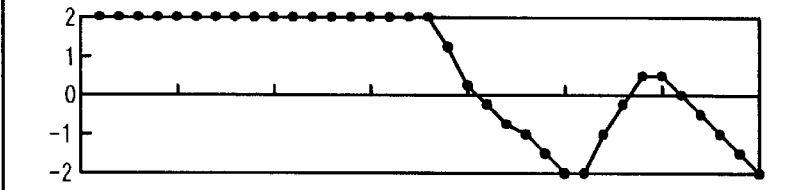
Figure 15E:
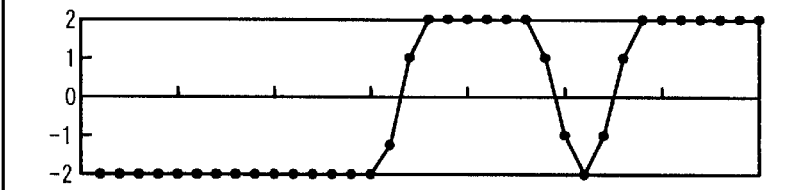
Figure 15F:
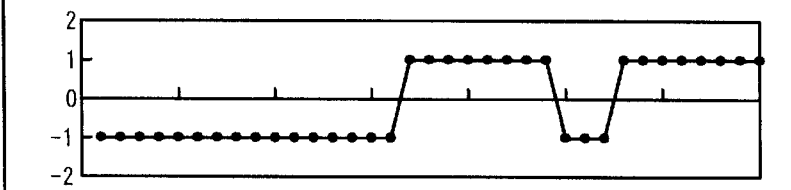

The embodiment shown in FIG. 1 is characterized in that an error propagation detector 20 and a slice offset control part 21 are in the MDFE circuit 10 shown in FIG. 14.

In FIG. 1, the input NRZ data is converted to (d, k) RLL codes and then written to the storage medium. The (d, k) RLL codes have been coded such that the minimum magnetization reversal interval is d (two or more), and the maximum magnetization reversal interval is k. These are called the "d constraint" and the "k constraint".

In the case of a (1, 7) RLL codes where d=1 and k=7, for example, the maximum continuance of same polarity codes is 8, and the number of continuous alternations is 1. Hereafter the embodiment will be described using the (1, 7) RLL codes.

At first, the detector 9 compares the read reproduction signal with a predetermined threshold value, and outputs the comparison result. Then the error propagation detector 20 judges whether the read reproduction signal violates the (1, 7) RLL code rule based on the detection output from the detector 9. In other words, the error propagation detector 20 judges whether the read reproduction signal violates the constraints where the maximum continuance of same polarity codes is 8 and the number of continuous alternations is 1.

If it is judged that the read reproduction signal violates the (1, 7) RLL code rule based on the comparison output from the detector 9, the error propagation detector 20 detects the generation of error propagation.

In other words, the error propagation detector 20 detects whether the maximum continuance of same polarity codes exceeded 8, that is, whether nine symbols or more of same polarity codes continued, or detects whether two symbols or more of continuous alternations of polarity occurred during the judgment of a violation against the (1, 7) RLL code rule.

Also, the error propagation detector 20 detects the end of continuation of nine symbols or more of same polarity codes, and the end of two symbols or more of continuous alternations of polarity.

Figure 2:
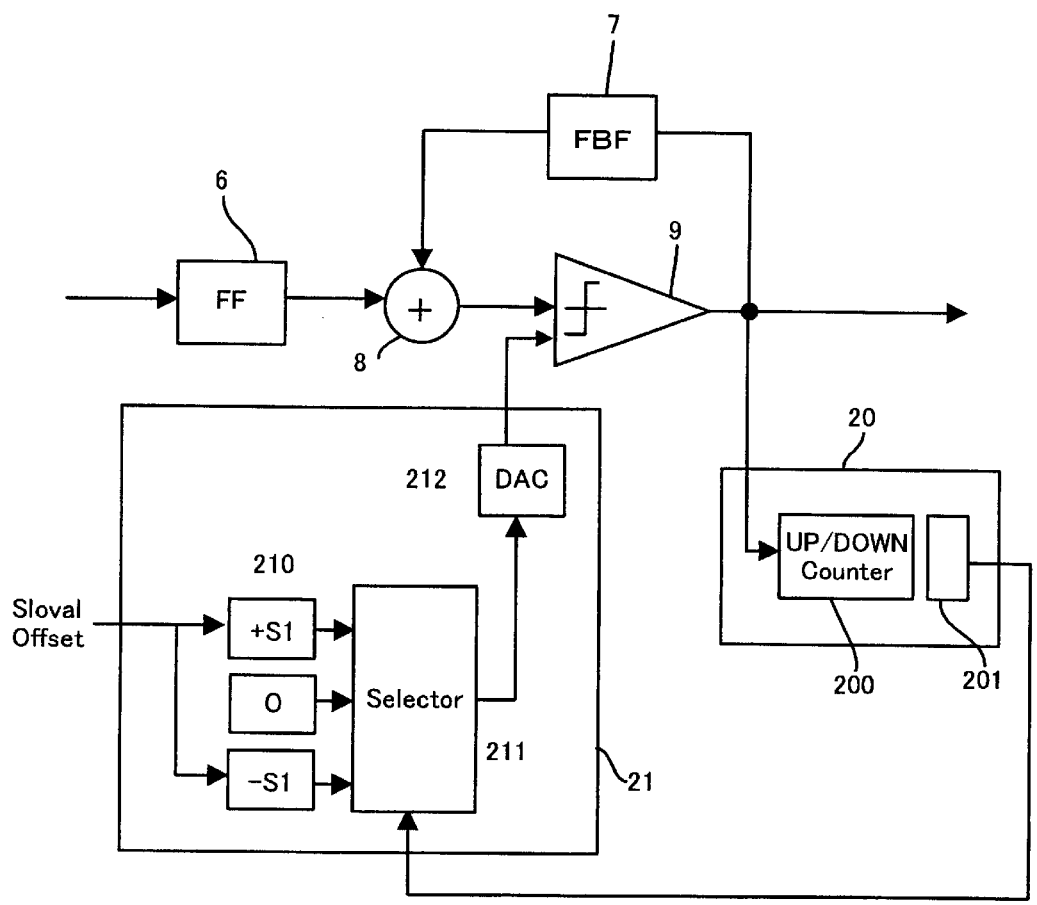
FIG. 2 is a block diagram depicting the configuration of the embodiment shown in FIG. 1.

FIG. 2 is a block diagram depicting the configuration of the embodiment shown in FIG. 1. The detector 9 is comprised of the comparator, which compares the reference value based on the slice level, and the level of the read signal from the forward filter 6.

The error propagation detector 20, which detects the continuance of nine symbols or more of same polarity codes and the end of the continuance of nine symbols or more of same polarity codes, can easily be configured using, for example, a counter 200 with a preset function.

A bit of the previous symbol is stored in the set circuit 201, and the difference between the stored bit of the previous symbol and a bit of the current symbol is determined. If the difference is 0, then the counter 200 advances.

If the set circuit 201 detects that the counter 200 counted 9, this means that nine symbols or more of same polarity codes continued, which violates the (1, 7) RLL code rule where the maximum continuance of same polarity codes is 8. If the difference is not 0, the counter 200 is reset since alternation occurred.

In this way, it is possible to detect the continuance of nine symbols or more of same polarity codes, and the end of the continuance of nine symbols or more of same polarity codes.

It is also possible to detect two symbols or more of continuous polarity alternations and the end of the continuous alternations using the counter 200. In this case, the difference between a bit of the previous symbol stored in the set circuit 201 and a bit of the current symbol is determined, and the counter 200 is advanced if the difference is not 0. If the difference is 0, then the counted value of the counter 200 is reset.

If the set circuit 201 detects that the counted value of the counter 200 became 2, two symbols or more of continuous polarity alternations can be detected. And it is judged that [the detected result] violates the (1, 7) RLL code rule where the number of continuous alternations is 1.

Figure 3A:
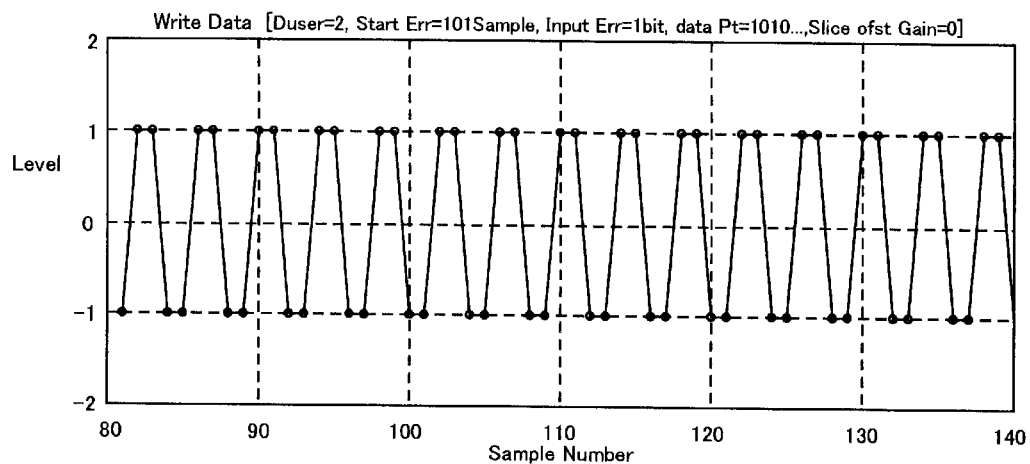
FIG. 3 is a diagram depicting an example when nine symbols or more of continuous same polarity codes exist.
Figure 3B:
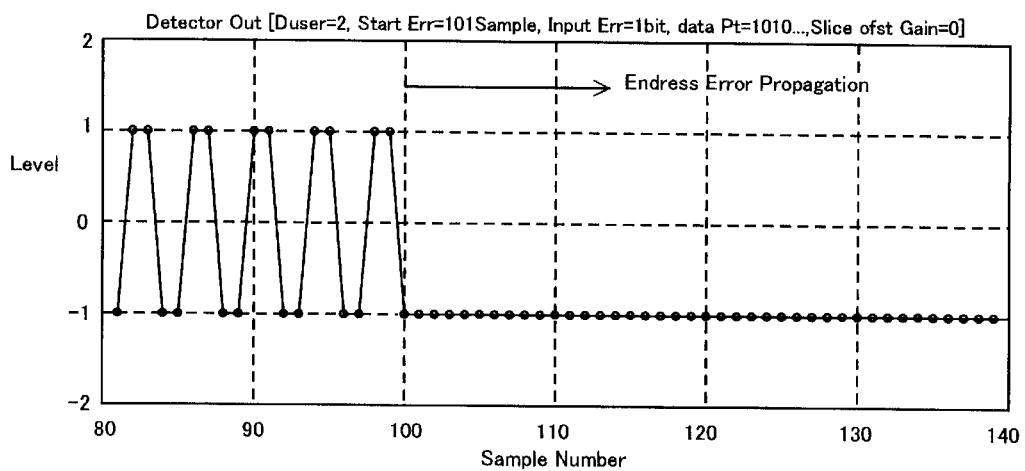

FIG. 3 is a diagram depicting an example when nine symbols or more of continuous same polarity codes exist. FIG. 3 (A) is a write data string. Whereas FIG. 3 (B) is a reproduction signal string which was read, where a signal at the $100^{th}$ sample is missing. As described above with reference to FIG. 14, the output of the detector 9 remains at a constant level if a signal is missing.

In the case of the example in FIG. 3, the error propagates and the output of the detector 9 is continuously fixed to +1 polarity after the signal at the $100^{th}$ sample is missed.

Figure 4A:
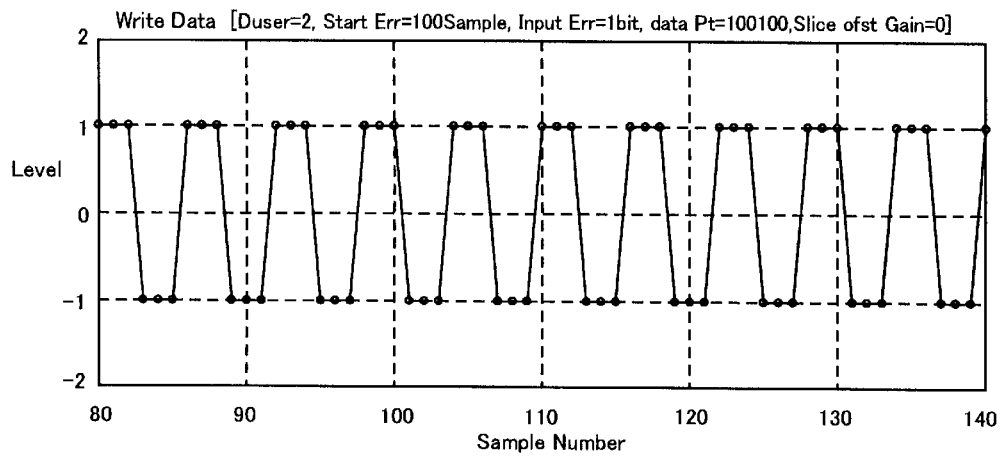
FIG. 4 is a diagram depicting an example when two symbols or more of continuous polar alternations exist.
Figure 4B:
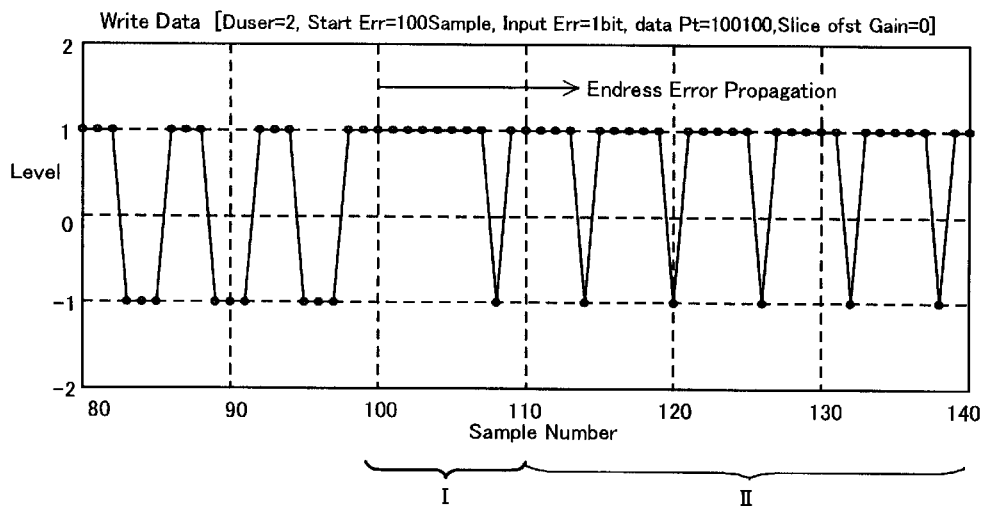

FIG. 4, on the other hand, is a diagram depicting an example when two symbols or more of continuous polar alternations exist. FIG. 4 (A) is a write data string. Whereas FIG. 4 (B) is a signal string which was read, where a signal at the $100^{th}$ sample is missing. As described above with reference to FIG. 14, the output of the detector 9 remains at a constant level if a signal is missing.

In the case of the example in FIG. 4, the error propagates and the output of the detector 9 is fixed to +1 for 10 samples (period I in FIG. 4 (B)), after the signal at the $100^{th}$ sample is missed, then two symbols or more of continuous polarity alternation is repeated (period II in FIG. 4 (B)). The counter of the error propagation detector 20 detects these states as error propagation, as described above.

Now the slice offset control part 21 in FIG. 1 will be described. The slice offset control part 21 controls to add an offset value to the slice level of the detector 9.

This means that the slice offset control part 21 calculates $$\Delta Slice = SLOVAL \cdot Sign\ [a(k)] \qquad (1)$$

Here ΔSlice is an offset value of the slice level of the detector 9, and the initial value is ΔSlice=0. Therefore, the detector 9 decides whether the output of the difference circuit 8 is +1 or −1 with respect to the 0 level.

In the above formula (1), SLOVAL is a predetermined offset value. Sign [a(k)] is a sign of the comparison output from the detector 9. According to the value of ΔSlice from the slice offset control part 21, the detector 9 shifts (offsets) the 0 decision criteria to the direction of the sign of the comparison output by the predetermined offset value.

The decision criteria to which this offset is added is held for a period of several clocks (samples) after error propagation ends.

The above mentioned slice offset control part 21 can be configured, for example, like the embodiment shown in FIG. 2. In other words, in FIG. 2, the slice offset control part 21 prepares the offset value ΔSlice=+S1, which is obtained by multiplying the predetermined offset value SLOVAL by +sign, and the offset value ΔSlice=−S1, which is obtained by multiplying by − sign, and the offset value ΔSlice=0, which is obtained by multiplying by 0, in the register 210.

The slice offset control part 21 is configured such that these offset values ΔSlice=+S1, or 0 are selected by the selector 211 on the basis of the output from the error propagation detector 20, and is output.

The offset value ΔSlice selected by the selector 211 is converted to an analog signal by the DA converter 212, and the offset value corresponding to the comparison reference level of the detector 9, which is comprised of a comparator, is added.

Figure 5A:
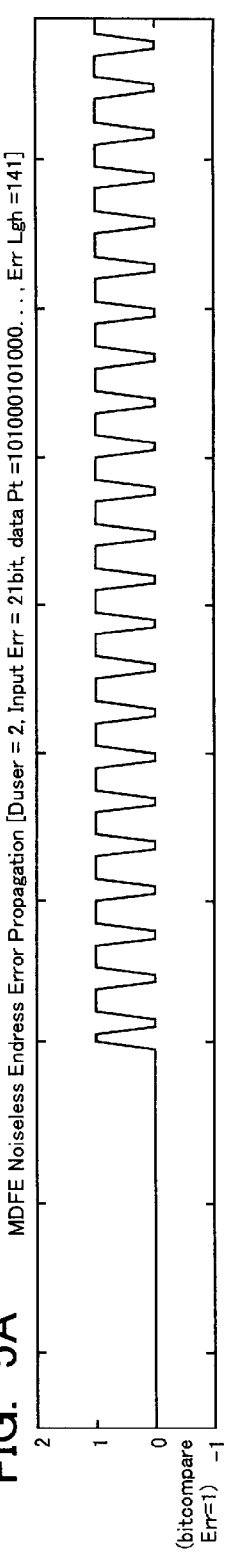
FIG. 5 is a diagram depicting a state when an error burst signal is inserted into the data pattern of the embodiment.
Figure 5B:
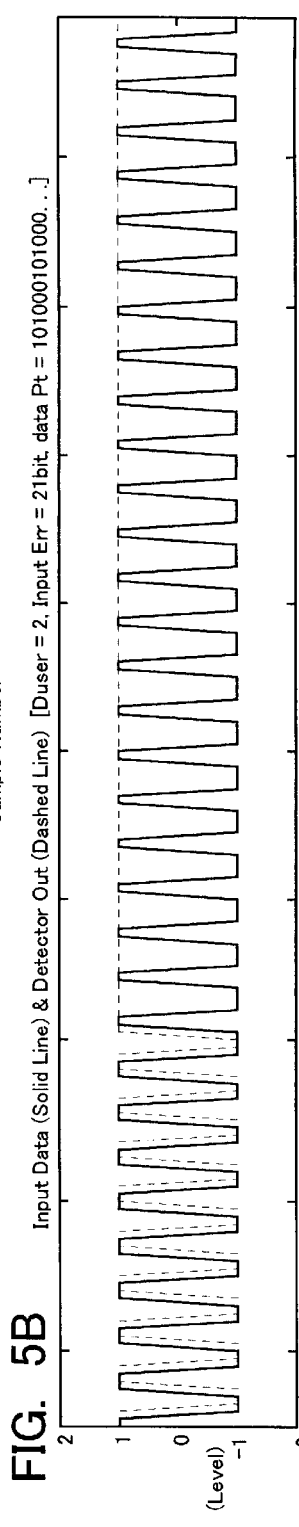
Figure 5C:
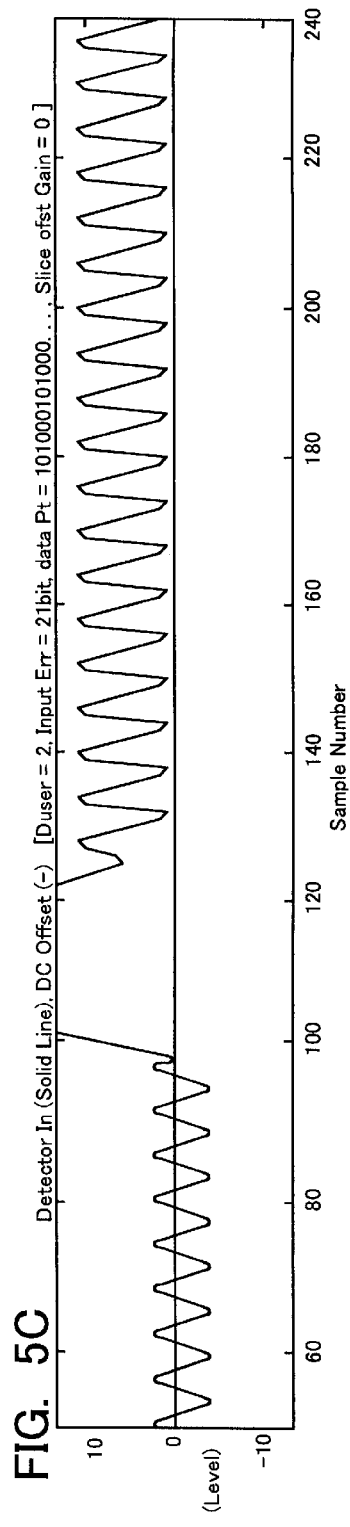

Now the control states by the slice offset control part 21 will be examined in more detail with reference to FIG. 5 and FIG. 6. FIG. 5 shows a state when 21 samples of error burst signals are inserted in a 100–120 sample period for the data pattern 10100101000 . . . .

In other words, FIG. 5 (A) shows that 0 is no error and 1 is an error in comparison with a normal bit, and shows the state where error propagates continuously after the period (100–120 sample period) when the error burst signal was inserted.

FIG. 5 (B) shows the input of the MDFE circuit 10 (solid line) and the output of the detector 9 (broken line) which are input to the difference circuit 8 respectively. FIG. 5 (C) shows the relationship between the input of the detector 9 and the decision criteria (slice level) at this time.

As FIG. 5 (C) shows, the input to the detector 9 exceeds "0", which is the decision criteria (slice level) after the error burst signal is inserted ($100^{th}$ sample and later). So, as FIG. 5 (B) shows, a "1" continues to be output from the detector 9 (broken line), and error propagation continues as shown in FIG. 5 (A).

FIG. 6, on the other hand, is a diagram corresponding to FIG. 5, depicting the case when control to add offset to the decision criteria (slice level) of the detector 9 by the output of the slice offset control part 21 shown in FIG. 1 is executed.

When the offset is added to the decision criteria (slice level) of the detector 9, if the error burst signal is inserted and the error propagation detector 20 decides the state as error propagation, as shown in FIG. 6 (C), then the slice offset control part 21 adds the slice level offset value 61 of ΔSlice to the decision criteria (slice level 1) 60.

In the case of the example in FIG. 6, the sign of the sample during error propagation is +, so the slice level offset value 61 is added also in the + direction.

In this way, the detector 9 can decide the input signal to be the decision criteria (slice level) or less. As a result, subsequent error propagation can be prevented.

Figure 7:
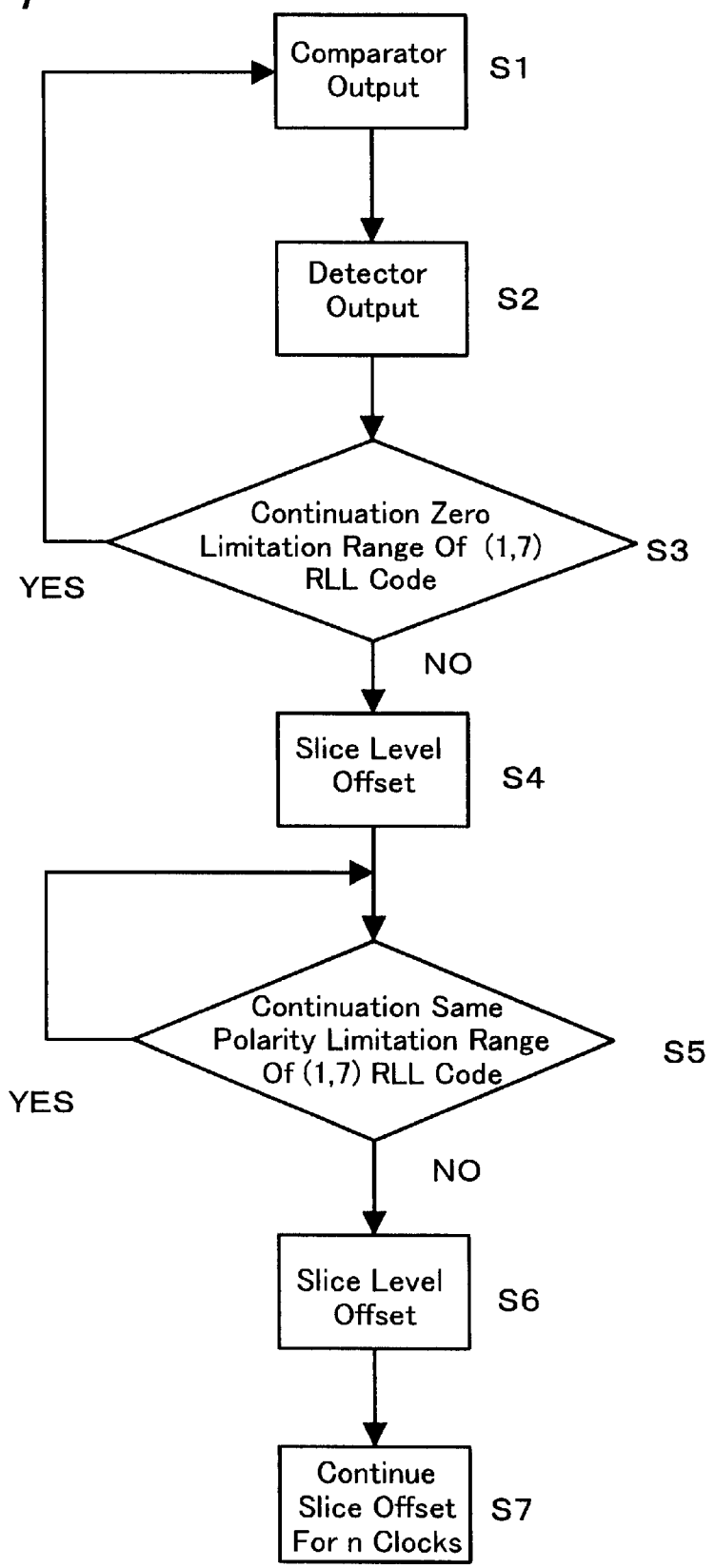
FIG. 7 is an operation flow of the embodiment in FIG. 1.

FIG. 7 is a flow chart depicting an operation flow of the MDFE circuit 10 in the above figures. In the difference circuit 8 in FIG. 1, the output of the forward filter 6 and the output of the feedback filter 7 are compared, and the difference is input to the detector 9 (Step S1).

The detector 9 compares the decision criteria (slice level) and the input level. The detector 9 outputs "1" if the input level is greater, and outputs "0" if the input level is lesser (Step S2).

Continuance of nine symbols or more of same polarity codes violates the (1, 7) RLL code rule. So, the error propagation detector 20 inputs the output from the detector 9, and decides whether nine symbols or more of same polarity codes continues (Step S3). In other words, the error propagation detector 20 decides whether the number of continuance of same polarity codes is within the continuation zero limitation range of the (1, 7) RLL code.

If nine symbols or more of same polarity codes continue, violating the (1, 7) RLL code rule, the error propagation detector 20 controls the slice offset control part 21 so as to add the slice offset value ΔSlice which is determined by the above formula (1) to the detector 9. In this way, the slice level of the detector 9 is shifted as described above with reference to FIG. 6 (C) (Step S4).

The error propagation detector 20 also inputs the output from the detector 9, and decides whether two symbols or more of continuous polarity alternation exists. In other words, the error propagation detector 20 decides whether the continuance of polarity alternation is within the polarity alternation limitation range of the (1, 7) RLL code (Step 5).

If two symbols or more of continuous polarity alternation exists, violating the polarity alternation limitation in the (1,

7) RLL code rule, the slice level of the detector 9 is also shifted (Step S6).

The error propagation detector 20 then adds the same slice offset for the n (a plural number) clocks of a period, and shifts the slice level of the detector 9 (Step S7).

In the embodiment shown in FIG. 1, the calculation to determine the slice offset value ΔSlice in the slice offset control part 21 can be determined by $$\Delta\text{Slice }(k)=\Delta\text{Slice }(k-1)+\text{TG\_SLO}\cdot\text{Sign }[a(k)] \quad (2)$$

instead of using the formula (1).

This formula (2) determines the slice offset value for the k-th sample, that is, ΔSlice (k), by accumulating the slice update gain TG_SLO with the slice offset value for the (k−1)th sample, that is, ΔSlice (k−1).

Therefore, in this embodiment, the upper limit MX_SLO and the lower limit MN_SLO of the slice offset level must be monitored to prevent the slice offset value to be accumulated from becoming too large.

In the case of this embodiment as well, the determined slice offset value for the k-th sample ΔSlice (k) is input to the detector 9, the slice level is shifted, and error propagation can be prevented.

Figure 8:
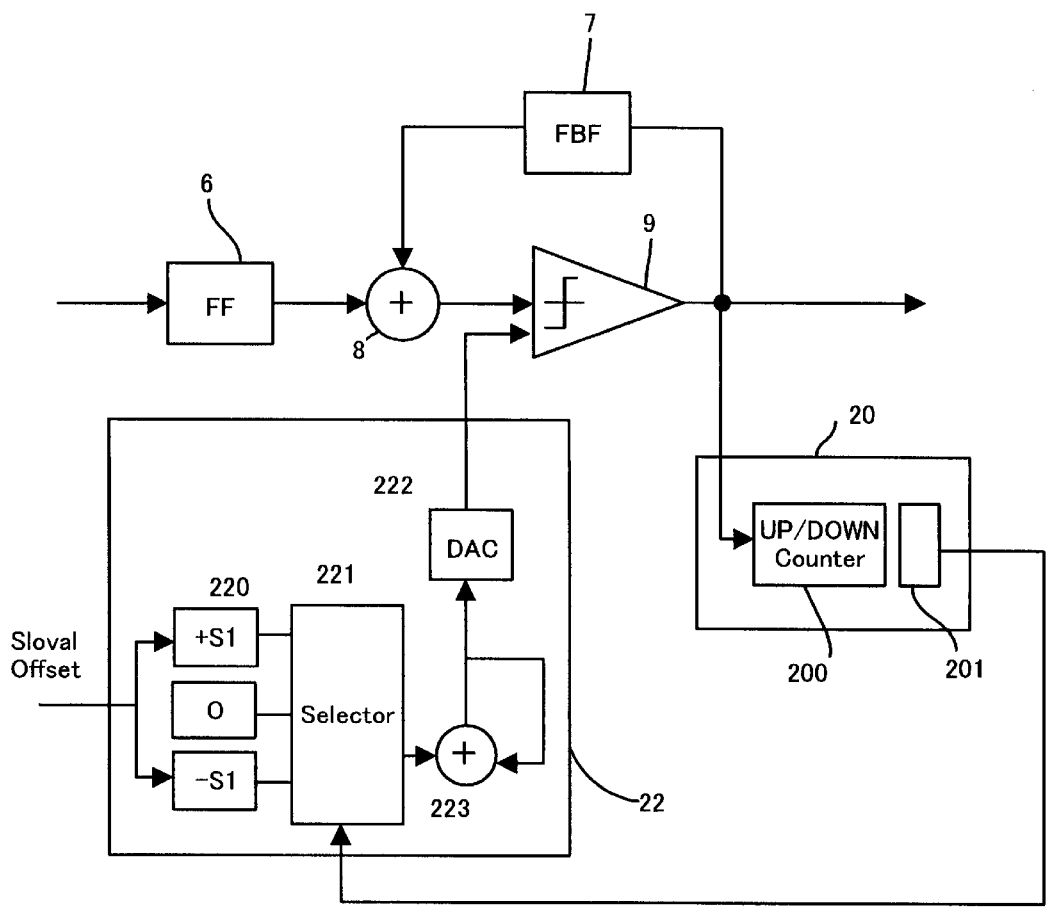
FIG. 8 is a block diagram depicting an example of a configuration of the slice offset control part 21, which generates the slice offset value ΔSlice according to the formula (2)

FIG. 8 is a block diagram depicting an example of a configuration of the slice offset control part 21, which generates the slice offset value ΔSlice according to the formula (2). An integrator 223 is disposed at the output side of the selector 221 in the slice offset control part 21 in the configuration shown in FIG. 2.

The k-th output of the selector 221 is added to the (k−1)th sample. In this way, the slice offset value is accumulated. As a result, the D/A converter 222 sets the analog output to be constant for the accumulated value which exceeds the upper limit MX_SLO and the lower limit MN_SLO, so as to prevent the slice offset value from becoming too large.

In the above embodiment, it may be necessary to make the offset block (length) of the slice level and the offset amount variable according to the type of error propagation (pattern of error propagation generation source).

In other words, there are different types of error propagation depending on the error propagation detection signal type, that is, error propagation when a d constraint is violated, error propagation when a k constraint is violated, and error propagation when the d and k constraints are satisfied. Therefore, the slice offset time or the slice offset amount must be controlled according to the type of error propagation.

On the other hand, gradually changing the offset amount may be preferable at the reset of the offset amount when slice offset ends. This may become necessary when the normalization line density Du is large.

In other words, the optimum value of the slice offset differs depending on the signal status, the normalization line density, for example. So it is desirable to control the slice offset amount to be added when error propagation is detected is changed according to the signal status, the normalization line density, for example.

Figure 9:
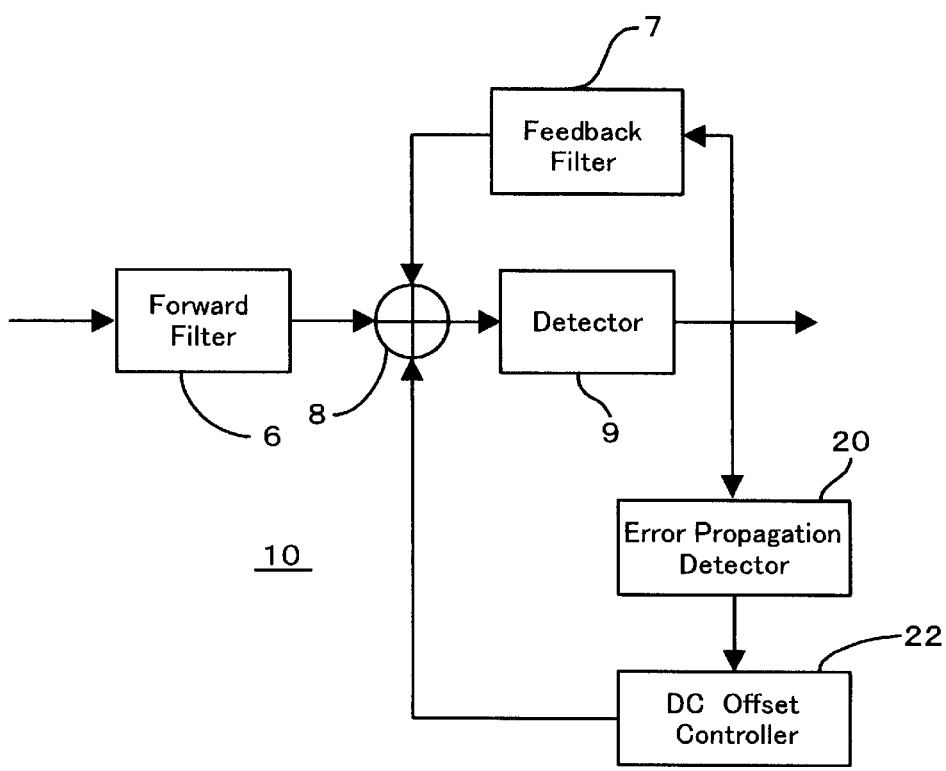
FIG. 9 is a block diagram depicting a second embodiment of the present invention.

FIG. 9 is a block diagram depicting a second embodiment of the present invention where the configuration of the MDFE circuit 10 in FIG. 1 is changed. Therefore, in FIG. 7, only the configuration block of the MDFE circuit 10 is shown to simplify the illustration.

The difference from the embodiment in FIG. 1 is that the DC offset control part 22 is disposed rather than the slice offset control part 21, which controls the slice offset value of the detector 9.

The error detection output from the error propagation detector 20 described with reference to FIG. 1 is input to the DC offset control part 22, and the offset value with respect to the DC level of the signal to be input to the detector 9 is determined using the formula (3).

$$\Delta\text{DC }(k)=\Delta\text{DC }(k-1)+\text{TG\_DCO}\cdot\text{Sign }[a(k)] \quad (3)$$

Here, the above formula (3) determines the DC offset value for the k-th sample ΔDC (k) by accumulating the DC offset update gain TG_DCO with the DC offset value for the (k−1)th sample ΔDC (k−1).

As described above for the formula (2), the upper limit MX-DCO and the lower limit MN-DCO of the DC offset level must be monitored to prevent the DC offset value to be accumulated from becoming too large.

In this way, the DC offset value ΔDC (k) determined by the DC offset control part 22 is input to the difference circuit 8, and the DC level of the output of the difference circuit 8 to be input to the detector 9 is shifted.

The error propagation detector 20 and the DC offset control part 2 in FIG. 9 can be configured in the same way as the previous embodiments. In other words, the error propagation detector 20 is configured using the counter 200 shown in FIG. 2. The DC offset control part 22 is configured in the same way as the slice offset control part 21 shown in FIG. 2. The offset here, however, is not a threshold value but a DC offset value.

Figure 10:
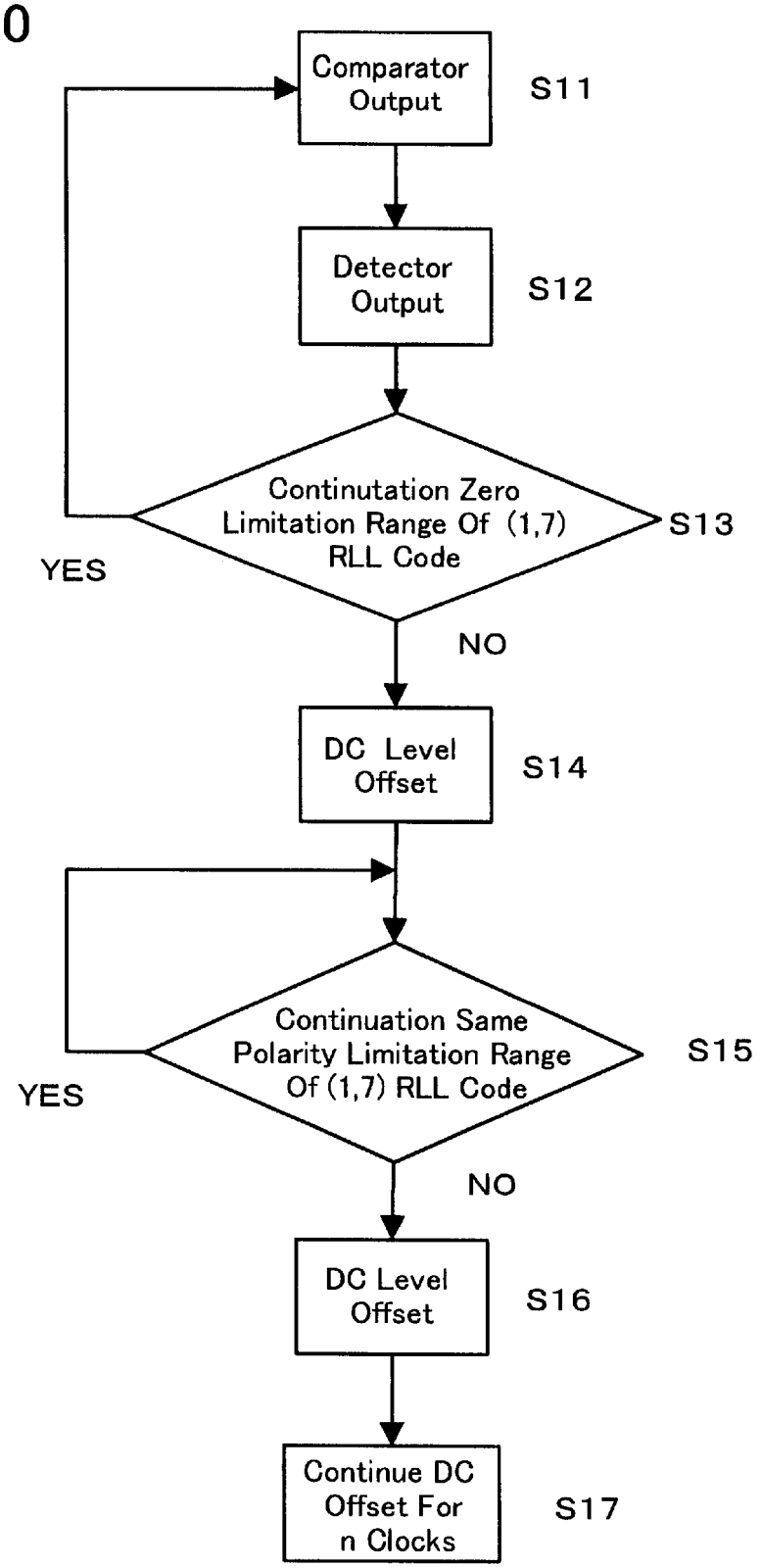
FIG. 10 is an operation flow of the embodiment in FIG. 9.

FIG. 10 is an operation flow of the embodiment in FIG. 9. In the difference circuit 8, the output of the forward filter 6 and the output of the feedback filter 7 are compared, and the difference is input to the detector 9 (Step S11). The detector 9 compares the decision criteria (slice level) and the input level, and outputs "1" if the input level is greater, and "0" if the input level is lesser (Step S12).

The continuance of the nine symbols or more of same polarity codes violates the (1, 7) RLL code rule. So the error propagation detector 20 inputs the output from the detector 9 and decides whether nine symbols or more of same polarity codes continue (Step S13).

If nine symbols or more of same polarity codes continue, violating the (1, 7) RLL code rule, the error propagation detector 20 controls the DC offset control part 21 so as to add the DC offset value ΔDC (k), which is determined by the above formula (3), to the detector 9, and shifts the DC level of the input signal of the detector 9 (Step S14). The direction of the shift of the DC level is controlled such that the DC level is shifted to the opposite direction from the error decision sign of the error propagation detector 20. By shifting the DC level in this way, error propagation can be controlled just like the case of controlling the slice level of the detector 9 in FIG. 1.

The error propagation detector 20 also inputs the output from the detector 9, decides whether two symbols or more of continuous polarity alternation exists (Step S15), and if two symbols or more of continuous polarity alternation exists, violating the (1, 7) RLL code rule, the DC level of the input signal of the detector 9 is shifted in the same way (Step S16).

The DC offset is maintained for a several clock period, and the DC level of the input signal of the detector 9 is shifted (Step S17).

Figure 11:
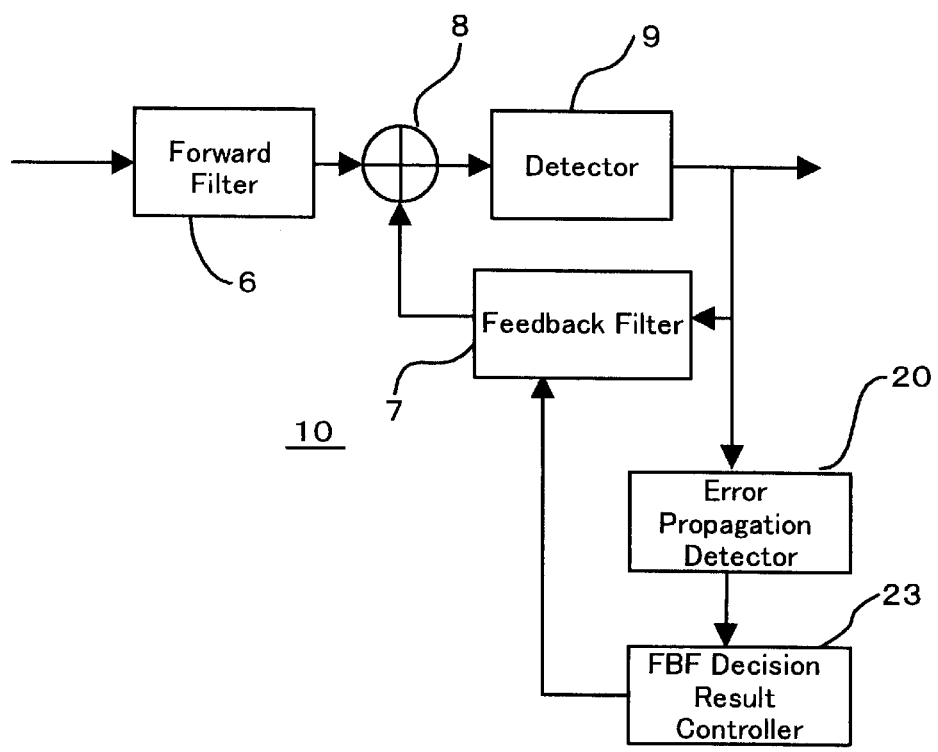
FIG. 11 is a block diagram depicting a third embodiment of the present invention.

FIG. 11 is a block diagram depicting a third embodiment of the present invention where the configuration of the MDFE circuit 10 in FIG. 1 is changed. Therefore, in FIG. 11 as well, only the configuration block of the MDFE circuit 10 is shown to simplify the illustration.

In contrast to the embodiments in FIG. 1 and FIG. 9, the embodiment in FIG. 11 is characterized in that a feedback filter (FBF) decision result control part 23 is disposed rather than the slice offset control part 21, which controls the slice offset value of the detector 9, or the DC offset control part 22, which controls the DC offset value with respect to the DC level of the input of the detector 9.

Here, the feedback filter 7, which has n number of taps, multiplies a sign of each tap Sign $[a_{k-m}]$ (where m=1-n) by a predetermined coefficient $g_m$, and accumulates the outputs of all the taps. Therefore, the cumulative output of the feedback filter 7 is given by the formula (4).

$$\Sigma\text{Sign}\,[a_{k-m}]\cdot g_m \qquad (4)$$

When the error propagation detector 20 described with reference to FIG. 1 detects a propagation error, the feedback filter (FBF) decision result control part 23 outputs a control signal so as to reverse the sign of the k-th–(k–1)-th tap coefficients, that is, Sign $[a_k]$–Sign $[a_{k-1}]$ of the feedback filter 7.

The feedback filter decision result control part 23 also reverses the sign of the k-th tap coefficient Sign $[a_F]$ during the period where error continues. When error propagation ends, [the feedback filter decision result control part 23] reverses the sign of the k-th tap coefficient Sign $[a_k]$ during n number of clocks. In this way, error propagation is controlled.

FIG. 12 is an operation flow of FIG. 11. In the difference circuit 8, the output of the forward filter 6 and the output of the feedback filter 7 are compared, and the difference is input to the detector 9 (Step S21). The detector 9 compares the decision criteria (slice level) and the input level, and outputs "1" if the input level is greater, and "0", if the input level is lesser (Step S22). Continuance of nine symbols or more of same polarity codes violates the (1, 7) RLL code rule. So the error propagation detector 20 inputs the output from the detector 9, and decides whether nine symbols or more of same polarity codes continue (Step S23).

If nine symbols or more of same polarity codes continue, violating the (1, 7) RLL code rule, [the error propagation detector 20] controls the feedback filter 7 so as to reverse the signs Sign $[a_k]$–Sign $[a_{k-1}]$ of the feedback filter 7 in the above formula (4) (Step S24).

The error propagation detector 20 also inputs the output from the detector 9, decides whether two symbols or more of continuous polarity alternation exists (Step S25), and if two symbols or more of continuous polarity alternation exists, violating the (1, 7) RLL code rule, the signs Sign $[a_k]$–Sign $[a_{k-1}]$ of the feedback filter 7 are also reversed (Step S26).

The error propagation detector 20 also maintains reversal of the sign Sign $[a_k]$ of the feedback filter 7 for an n (a plural number) clock period. In this case as well, error propagation can be controlled. This is because the output of the feedback filter 7 changes so as to become reverse polarity of the pulse polarity when an input pulse is generated, and the feedback filter 7 assumes that the polarity of the input reproduction signal pulse alternates.

In each embodiment described above, when an error propagates, codes are not in a zero crossing state for a predetermined period (in the case of a (1, 7) RLL code, nine or more same polarity codes continue) during an error propagation continuing block, or codes are in a continuous zero crossing state for a predetermined period (in the case of a (1, 7) RLL code, the continuous code polarity alternation length is 2 symbols or more) during an error propagation continuing lock.

So, the error propagation detector 20 is used to detect the maximum code limitation length and the minimum code limitation length for RLL.

The application of the present invention, however, is not limited to such a case. Table 1 shows the states during error propagation in each part of a magnetic disk device.

TABLE 1

| Item | Signal location | Condition | State |
|---|---|---|---|
| 1 | Head reproduction signal | When error propagation starts | Same polarity continues |
| 2 | FWF reproduction | When error propagation starts | Ibid. |
| 3 | Input signal for detector | When error propagation starts | Amplitude of signal is high |
| 4 | FBF output signal | Error propagation continuing block | No zero crossing |
| 5 | Input for detector 9 | Error propagation continuing block | No zero crossing |
| 6 | Input for detector 9 | Error propagation continuing block | No zero crossing |
| 7 | Input for detector 9 | Error propagation continuing block | Continuous zero crossing |

Table 2 shows the error propagation states during TA (Thermal Asperity).

TABLE 2

| Item | Signal location | Condition | State |
|---|---|---|---|
| | Head reproduction signal | When error propagation starts | Signal amplitude is high |
| | FWF output signal | When error propagation starts | Signal amplitude is high |
| | Detector input signal | When error propagation starts | Signal amplitude is high |

Table 3 shows the error propagation detection methods according to the error propagation states in Table 1 and Table 2, where the present invention can be applied. In Table 3, the error propagation detection methods corresponding to *6 and *7 are the error propagation detection methods corresponding to the error propagation detector 20 of the above mentioned embodiment of the present invention.

TABLE 3

| Above mentioned item | Detection method | Remarks |
|---|---|---|
| 1, 2 | Peak detection | |
| 1, 2 | Level detection | |
| 1, 2 | Peak detection + level detection | |
| 3 | Level detection | |
| 4, 5, *6 | Exceeding RLL maximum code limitation length | Maximum code limitation length for RLL |
| 4, 5, 6 | Comparing result of detecting a known predetermined pattern with target pattern | Known predetermined pattern |
| | Less than RLL minimum code limitation length level Level detection | Minimum code limitation length for RLL |

Table 4 shows the methods for controlling the error propagation which are detected on the basis of the error propagation detection methods in Table 3.

TABLE 4

| Handling | State | Embodiment |
| --- | --- | --- |
| Detector slice level | Offset | FIG. 1 |
| Detector input signal | Offset | FIG. 7 |
| Known decision result | Reversal | FIG. 9 |

The above mentioned embodiments are based on the assumption that error propagation is detected using the sign of the data part, but constraints for the preamble of a signal may be used.

In other words, when (d, k) RLL coded data is read, preamble patterns and synchronous words must be read before reading the data. For these patterns, patterns which are not related to (d, k) RLL coding may be used.

In the case of 1–7 MDFE, for example, a 3T (NRZ notation: 111000, NRZI notation: 100100) continuing pattern is used for the preamble pattern, and a 6T6T9T3T pattern (NRZ notation: 111111000000111111111000 after the last "1" of the preamble, NRZI notation: 000000100000100000000100) is used for the synchronous word.

Therefore, in the case of a preamble, the detection result which is 2T or less and 4T or more is detected to decide the error propagation. In the case of the synchronous word, on the other hand, the detection result which is 2T or less and 10T or more is detected to decide the error propagation.

In this way, error propagation detection conditions can be changed according to the read information (preamble pattern, synchronous word, and data).

In the above embodiments, error propagation is detected with k+1 for the k constraint violation during (k, d) RLL coding. However, in order to prevent excessive detection of error propagation, it is also possible to configure such that error propagation is detected not only with k+1 but also with k+2, and for d constraint violation, error detection is decided when two or more times of d constraint violation occurs during predetermined clocks.

Industrial Applicability

Figure 13:
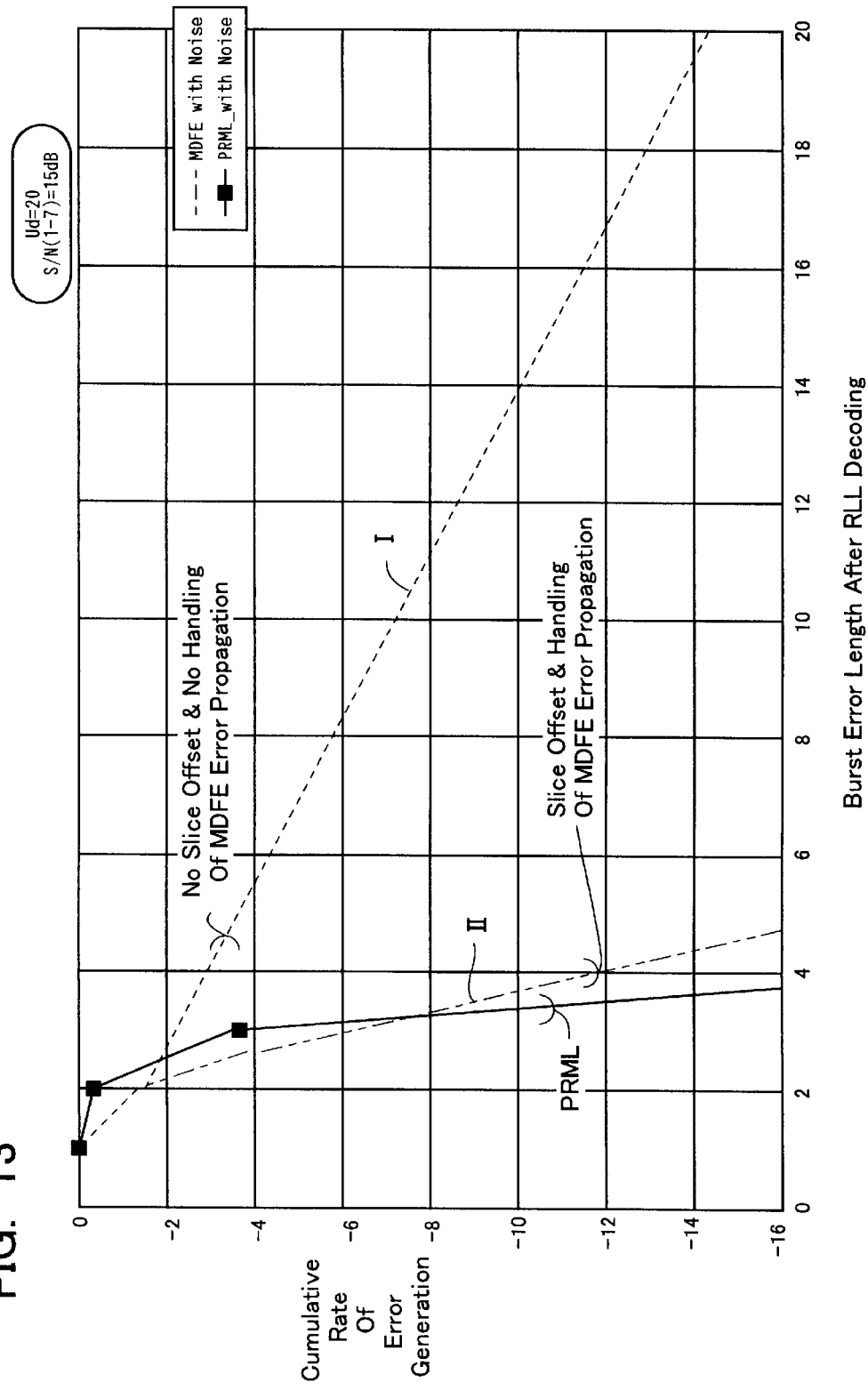
FIG. 13 is an example depicting an effect of the present invention.

As described in the embodiments with reference to the drawings, error propagation in a system which uses MDFE can be controlled by the present invention. FIG. 13 is an example depicting the effect of the present invention where the length of propagation is compared depending on the use/non-use of handling by the present invention when MDFE and PRML (Partial Response Most Likelihood) input burst error occurs.

In FIG. 13, I is an error propagation characteristic when the handling for MDFE error propagation is not used, and II is an error propagation characteristic when a slice offset is added to the detector 9 in accordance with the present invention. In this way, the present invention allows controlling error propagation and providing a storage device which can read data at higher speeds.

What is claimed is:

1. An error propagation control method based on decision feedback equalization comprising the steps of:

outputting the difference or sum of an input signal and a feedback signal;

detecting a level for said output difference or sum with reference to a slice level;

feeding back said detected level as the feedback signal to an input signal side;

deciding an error propagation state of said input signal, based on said detected level; and adding a predetermined offset to said slice level based on said decided error propagation state.

2. An error propagation control method based on decision feedback equalization comprising the steps of:

outputting the difference or sum of an input signal and a feedback signal;

detecting a level for said output difference or sum with reference to a slice level;

feeding back said detected level as the feedback signal to an input signal side;

deciding an error propagation state of said input signal based on said detected level; and adding a predetermined DC offset to a DC level of said input signal for which the level is detected with reference to the slice level, based on said decided error propagation state.

3. An error propagation control method based on decision feedback equalization comprising the steps of:

outputting the difference or sum of an input signal and a feedback signal;

detecting a level for said output difference or sum with reference to a slice level;

feeding back said detected level as the feedback signal to an input signal side;

deciding an error propagation state of said input signal based on said detected level; and reversing the sign of a tap of a feedback filter which feeds back said decided level to said input signal side, based on said decided error propagation state.

4. A magnetic reproducing circuit comprising:

an input circuit for outputting the difference or sum of an input signal read from a magnetic recording medium and a feedback signal;

a detector for deciding a positive or negative polarity of the output difference or sum of the input signal and the feedback signal with reference to a slice level;

a feedback filter for feeding back to the input circuit a sum obtained by multiplying a predetermined coefficient to the output of said detector as the feedback signal; and a slice offset control part for adding a predetermined offset to the slice level of said detector based on an error propagation state of said input signal.

5. The magnetic reproducing circuit according to claim 4, further comprising an error propagation detection part for deciding the error propagation state of said input signal based on the output of said detector.

6. The magnetic reproducing circuit according to claim 4, further comprising an error propagation detection part which decides said error propagation state as a d constraint violation state or k constraint violation state when the input signal for which the difference or sum with said feedback signal is determined is (d, k) coded such that a minimum magnetization reversal interval is d and a maximum magnetization reversal interval is k.

7. The magnetic reproducing circuit according to claim 4, further comprising an error propagation detection part for detecting a state where two or more samples of a polarity alternation continue or k+2 or more samples of same polarity signals continue as said error propagation state when the input signal for which the difference or sum with said feedback signal is determined and is read from said magnetic recording medium, and is encoded with a (d, k) run length limited coding such that a minimum magnetization reversal interval is d being equal to 1 or more and a maximum magnetization reversal interval is k.

8. The magnetic reproducing circuit according to claim 4, further comprising an error propagation detection part for detecting the state where nine or more samples of same polarity signals continue or two or more samples of polarity alternation continue as said error propagation state when said input signal for which the difference or sum with said feedback signal is determined is (1, 7) coded such that a minimum magnetization reversal interval is 1 and a maximum magnetization reversal interval 7.

9. The magnetic reproducing circuit according to claim 4, further comprising an error propagation detection part for detecting a case where two or more samples of continuance of polarity alternation is generated two or more times or the case where k+3 or more samples of same polarity signals continue as said error propagation state, when said input signal for which the difference or sum with said feedback signal is determined is (d, k) coded such that a minimum magnetization reversal interval is d and a maximum magnetization reversal interval is k.

10. The magnetic reproducing circuit according to claim 4, wherein when said input signal for which the difference or sum with said feedback signal is determined is (d, k) coded such that a minimum magnetization interval is d and a maximum magnetization reversal interval is k, said input signal has a plurality of (d, k) limitations, and a decision of violating a d constraint or a k constraint corresponding to a respective (d, k) limitation can be selected.

11. A magnetic reproducing circuit comprising:
an input circuit for outputting the difference or sum of an input signal read from a magnetic recording medium and a feedback signal;
a detector for deciding a positive or negative polarity of the output difference or sum with reference to a slice level;
a feedback filter for feeding back to the input circuit a sum obtained by multiplying a predetermined coefficient to the output of said detector as the feedback signal; and
a DC offset control part for adding a DC offset to a DC level of the output from the input circuit, based on an error propagation state of said input signal.

12. The magnetic reproducing circuit according to claim 11, further comprising an error propagation detection part for deciding the error propagation state of said input signal based on the output of said detector.

13. The magnetic reproducing circuit according to claim 11, further comprising an error propagation detection part which decides said error propagation state as a d constraint violation state or k constraint violation state when the input signal for which the difference or sum with said feedback signal is determined is (d, k) coded such that a minimum magnetization reversal interval is d and a maximum magnetization reversal is k.

14. The magnetic reproducing circuit according to claim 11, further comprising an error propagation detection part for detecting a state where two or more samples of polarity alternation continue or k+2 or more samples of same polarity signals continue as said error propagation state when the input signal for which the difference or sum with said feedback signal is determined and is read from said magnetic recording medium, and is encoded with a (d, k) run length limited coding such that a minimum magnetization reversal interval is d being equal to 1 or more and a maximum magnetization reversal interval is k.

15. The magnetic reproducing circuit according to claim 11, further comprising an error propagation detection part for detecting the stat where nine or more samples of same polarity signals continue or two or more samples of polarity alternation continue as said error propagation state when said input signal for which the difference or sum with said feedback signal is determined is (1, 7) coded such that a minimum magnetization reversal interval is 1 and a maximum magnetization reversal interval is 7.

16. The magnetic reproducing circuit according to claim 11, further comprising an error propagation detection part for detecting the case where two or more samples of continuance of polarity alternation is generated two or more times or the case where K+3 or more samples of same polarity signals continue as said error propagation state, when said input signal for which the difference or sum with said feedback signal is determined is (d, k) coded such that a minimum magnetization reversal interval is d and a maximum magnetization reversal interval is k.

17. The magnetic reproducing circuit according to claim 11, wherein when said input signal for which the difference or sum with said feedback signal is determined is (d, k) coded such that a minimum magnetization interval is d and a maximum magnetization reversal interval is k, said input signal has a plurality of (d, k) limitations, and a decision of violating a d constraint or a k constraint corresponding to a respective (d, k) limitation can be selected.

18. A magnetic reproducing circuit comprising:
an input circuit for outputting the difference or sum of an input signal read from a magnetic recording medium and a feedback signal;
a detector for deciding a positive or negative polarity of the output difference or sum with reference to a slice level;
a feedback filter for feeding back to the input circuit a sum obtained by multiplying a predetermined coefficient to the output of said detector as the feedback signal; and
a control part for reversing the sign of a tap of said feedback filter based on an error propagation state of said input signal.

19. The magnetic reproducing circuit according to claim 18, further comprising an error propagation detection part for deciding the error propagation state of said input signal based on the output of said detector.

20. The magnetic reproducing circuit according to claim 18, further comprising an error propagation detection part which decides said error propagation state as a d constraint violation state or k constraint violation state when the input signal for which the difference or sum with said feedback signal is determined is (d, k) coded such that a minimum magnetization reversal interval is d and a maximum magnetization reversal interval is k.

21. The magnetic reproducing circuit according to claim 18, further comprising an error propagation detection part for detecting a state where two or more samples of polarity alternation continue or k+2 or more samples of same polarity signals continue as said error propagation state when the input signal for which the difference or sum with said feedback signal is determined and is read from said magnetic recording medium, and is encoded with a (d, k) run length limited coding such that a minimum magnetization reversal interval is d being equal to 1 or more and the maximum magnetization reversal interval is k.

22. The magnetic reproducing circuit according to claim 18, further comprising an error propagation detection part for detecting the state where nine or more samples of same polarity signals continue or two or more samples of polarity alternation continue as said error propagation state, when said input signal for which the difference or sum with said feedback signal is determined is (1, 7) coded such that a minimum magnetization reversal interval is 1 and a maximum magnetization reversal interval is 7.

23. The magnetic reproducing circuit according to claim 18, further comprising an error propagation detection part for detecting the case where two or more samples of continuance of polarity alternation is generated two or more times or the case where K+3 or more samples of same polarity signals continue as said error propagation state, when said input signal for which the difference or sum with said feedback signal is determined is (d, k) coded such that a minimum magnetization reversal interval is d and a maximum magnetization reversal interval is k.

24. The magnetic reproducing circuit according to claim 18, wherein when said input signal for which the difference or sum with said feedback signal is determined is (d, k) coded such that a minimum magnetization interval is d and a maximum magnetization reversal interval is k, said input signal has a plurality of (d, k) limitations, and a decision of violating a d constraint or a k constraint corresponding to a respective (d, k) limitation can be selected.

* * * * *